United States Patent
Sano et al.

(10) Patent No.: US 6,172,357 B1
(45) Date of Patent: *Jan. 9, 2001

(54) PHOTOELECTRIC TILT-DETECTING SENSOR AND METHOD OF FABRICATING THE SAME

(75) Inventors: Masashi Sano; Kazuhito Sakai, both of Kyoto (JP)

(73) Assignee: Rohm Co., Ltd., Kyoto (JP)

( * ) Notice: Under 35 U.S.C. 154(b), the term of this patent shall be extended for 0 days.

This patent is subject to a terminal disclaimer.

(21) Appl. No.: 09/399,819

(22) Filed: Sep. 21, 1999

Related U.S. Application Data

(62) Division of application No. 08/714,988, filed on Sep. 17, 1996, now Pat. No. 6,011,254.

(30) Foreign Application Priority Data

| Sep. 21, 1995 | (JP) | 7-242795 |
| Sep. 25, 1995 | (JP) | 7-246403 |
| Oct. 24, 1995 | (JP) | 7-275968 |
| Aug. 23, 1996 | (JP) | 8-222851 |

(51) Int. Cl.[7] .............. H01L 21/00; G01D 5/34
(52) U.S. Cl. ............ 250/231.1; 438/25; 438/28
(58) Field of Search ............... 250/231.1, 221, 250/229, 239; 340/689; 200/61.45 R; 438/24, 25, 26, 28, 34

(56) References Cited

U.S. PATENT DOCUMENTS

| 2,952,184 | 9/1960 | Bakke et al. . |
| 4,364,489 | 12/1982 | Alexeeff . |
| 4,538,731 | 9/1985 | Cillario . |
| 4,655,342 | 4/1987 | Brauner et al. . |
| 4,726,091 | 2/1988 | Joyce . |
| 4,727,248 | 2/1988 | Meur et al. . |
| 5,127,537 | 7/1992 | Graham . |
| 5,202,559 | 4/1993 | Durst . |
| 5,373,153 | 12/1994 | Cumberledge et al. . |

FOREIGN PATENT DOCUMENTS

| 31 12 057 A1 | 3/1980 | (DE) . |
| 35 40948 C2 | 5/1987 | (DE) . |
| 91 06 217 | 9/1991 | (DE) . |
| 91 06 217 U1 | 11/1991 | (DE) . |
| 2 072 838 | 10/1981 | (GB) . |
| 6045637 | * 2/1994 | (JP) . |

* cited by examiner

Primary Examiner—John R. Lee
Assistant Examiner—Kevin Pyo
(74) Attorney, Agent, or Firm—Arent Fox Kintner Plotkin & Kahn, PLLC

(57) ABSTRACT

Disclosed is a photoelectric tilt-detecting sensor which, while simple in structure, is reduced of traveling-around of light transmitted therein to thereby improve the signal-to-noise ratio. The tilt-detecting sensor has a light-emitting element and a light-receiving element respectively fixed in an opposed relation in a main body, and slant surfaces provided between the light-emitting element and the light-receiving element to define a space in the main body. The slant surfaces has an elongate groove so that a spherical ball is allowed to stably move therealong. A lid integral with the main body enables bending thereof to enclose the space of the main body. These lid and the main body is formable in one body by using dies through simplified processes, realizing large-scaled production.

2 Claims, 14 Drawing Sheets

PHOTOELECTRIC TILT-DETECTING SENSOR AND METHOD OF FABRICATING THE SAME

This is a divisional application of Ser. No. 08/714,988 filed Sep. 17, 1996, now U.S. Pat. No. 6,011,254.

BACKGROUND OF THE INVENTION

This invention relates to a photoelectric tilt-detecting sensor for detecting the presence or absence of tilting of an object to be detected, and a method of fabricating the same.

There have been known photo-interrupters for use in various applications of optical sensors. The photo-interrupter generally includes a light-emitting element for emitting light, and a light-receiving element for receiving the light emitted therefrom. The photo-interrupter is utilized to determine whether or not a certain object is present between these two optical elements, by detection of an electric current generated from reception of light by the light-receiving element.

The conventionally known photoelectric tilt-detecting sensor, as shown in FIG. 13, comprising a photo-interrupter 31 formed by a light-emitting element 31a and a light-receiving element 31b. The photo-interrupter 31 is built in a lower case 32 for the sensor formed of a resin, with an upper case 33 fitted over the lower case 32. The upper case 33 has opposite bearing supports 33a extending therefrom toward the inner side of the lower case 32. A fan-shaped light-shielding plate 34 is pivotally supported on bearings 33b for swinging between the light-emitting element 31a and the light-receiving element 31b.

In the tilt-detecting sensor thus constructed, the light-shielding plate 34 ordinarily rests at its lowest position due to the action of gravity. To use the tilt-detecting sensor, it is mounted or fixed on an object to be detected, not shown. While the tilting angle is smaller than a certain value, the light emitted from the light-emitting element 31a is shielded by the light-shielding plate 34 and no light is transmitted to the light-receiving element 31b. However, if the angle of tilting exceeds the above angle, the light-shielding plate 34 goes out between the light-emitting element 31a and the light-receiving element 31b. As a result, the light emitted is transmitted to the light-receiving element 31b. The light-receiving element 31b, upon reception of light, generates an electric current to supply the same through lead terminals thereof, making possible detection of the tilting for the object to be detected.

Meanwhile, there is increase in demands of offering sensors integral with a photo-interrupter, as the technology in the art of semiconductor or optical devices advances. On the other hand, it is strongly demanded that the number of parts be reduced for making such devices, together with simplification of fabrication processes.

However, the conventional tilt-detecting sensor necessitates bearings 33b on the upper case 33 for assembling a light-shielding plate 34 therein. Besides the light-shielding plate 34 has to be assembled by inserting its support axis into the respective bearings 33b. This light-shielding plate 34 must be formed relatively complicated in shape, or otherwise assembled with a separate support shaft, thus incurring complexity in fabrication processes. In practical, there is difficulty of reducing the number of parts used and simplifying the fabrication processes.

Further, in the conventional tilt-detecting sensor, there is a problem left in smoothness of movement of the light-shielding plate which is in pivotal support by the opposite bearings. The light-shielding plate thus mechanically structured is apt to lose its smoothness in movement, particularly where an external impact force be applied or tilting is in other direction than the direction being detected.

SUMMARY OF THE INVENTION

It is therefore an object of the present invention to provide a phtoelectric tilt-detecting sensor which, while simple in structure, is to smoothly actuate in detection of tilting.

It is another object of the invention to make possible detection of direction to which an object to be detected is tilted.

It is a further object of the invention to provide reliability in structure, preventing disengagement of a lid from the main body.

It is a still further object of the invention to provide a method for fabricating a photoelectric tilt-detecting sensor through simplified processes.

According to a first aspect of the present invention, there is provided a photoelectric tilt-detecting sensor comprising:
  a light-emitting element for emitting light;
  a light-receiving element for receiving the light emitted from the light-emitting element;
  a main body molding the light-emitting element and the light-receiving element in an opposed relation, the main body having slant surfaces in a lower portion thereof to define a space therein;
  a spherical ball accommodated in the space so as to be movable along the slant surfaces;
  a lid fitted over the main body to enclose the space; and
  a ball guide means provided in the slant surfaces for guiding the movement of the spherical ball.

Therefore, the ball guide means serves as a guide for stable movement of the spherical ball along the slant surfaces. Besides, the ball guide means acts to prevent the light from traveling around the spherical ball and reaching the light-receiving element, sensibly detecting the inclination of an object to be detected and providing reliability in tilt detection.

It is preferred that the slant surface have a bottom formed continuous therewith, the bottom is of a curved surface having a radius corresponding to that of the spherical ball with respect to a direction of the slant surface. With such a structure, the spherical ball rests stably on the bottom when the sensor is not tilted.

It is also preferred that an additional ball guide means is further provided in an inner surface of the lid. This further reduces the traveling-around of light emitted.

It is further preferred that additional light-emitting element and light-receiving element are further provided at such positions that no light is transmitted from the additional light-emitting element to the additional light-receiving element due to shielding of light by the spherical ball when the spherical ball rests on the slant surface other than the bottom. This makes possible detection of the direction to which the tilting takes place.

According to a second aspect of the present invention, there is provided a photoelectric tilt-detecting sensor comprising:
  a light-emitting element for emitting light;
  a light-receiving element for receiving the light emitted from the light-emitting element;
  a main body molding the light-emitting element and the light-receiving element in an opposed relation, the main body having slant surfaces in a lower portion thereof to define a space therein;

a spherical ball accommodated in the space so as to be movable along the slant surfaces; and a lid fitted over the main body to enclose the space, wherein the lid has one end thereof connected by integral forming to the main body and the other end thereof engaged with the main body.

It is therefore possible to prevent the lid from disengaging from the main body, thereby providing the reliability of structure.

According to a third aspect of the present invention, there is provided a method of fabricating a photoelectric tilt-detecting sensor having a light-emitting element and a light-receiving element provided in an opposed relation so as to accommodate a spherical ball therebetween, comprising the steps of:

preparing forming dies, the dies has a cavity for forming a main body and a lid connected at one end thereof to the main body;

placing a light-emitting element and a light-receiving element between the dies;

filling a resin into the cavity of the dies to provide a main body and a lid in one body and slant surfaces defining a space between the light-emitting element and the light-receiving element in the main body;

inserting a spherical ball into the space of the main body after setting of the resin; and bending the lid for engagement at the other end thereof with the main body.

It is accordingly possible to fabricate a photoelectric tilt-detecting sensor through simplified fabrication processes.

It is preferred that a plurality of light-emitting elements may be prepared as the light-emitting element on a lead frame, a plurality of light-receiving elements be prepared as the light-receiving element on another lead frame, and the lead frames having light-emitting elements and light-receiving elements be placed between the dies to thereby forming a plurality of main bodies at one time.

The fabrication process, if so carried out, help improve efficiency of manufacture, making possible production of photoelectric tilt-detecting sensors on a large scaled basis.

DETAILED DESCRIPTION

The present invention is now described in detail by referring to drawings showing an embodiment thereof.

Figure 1:
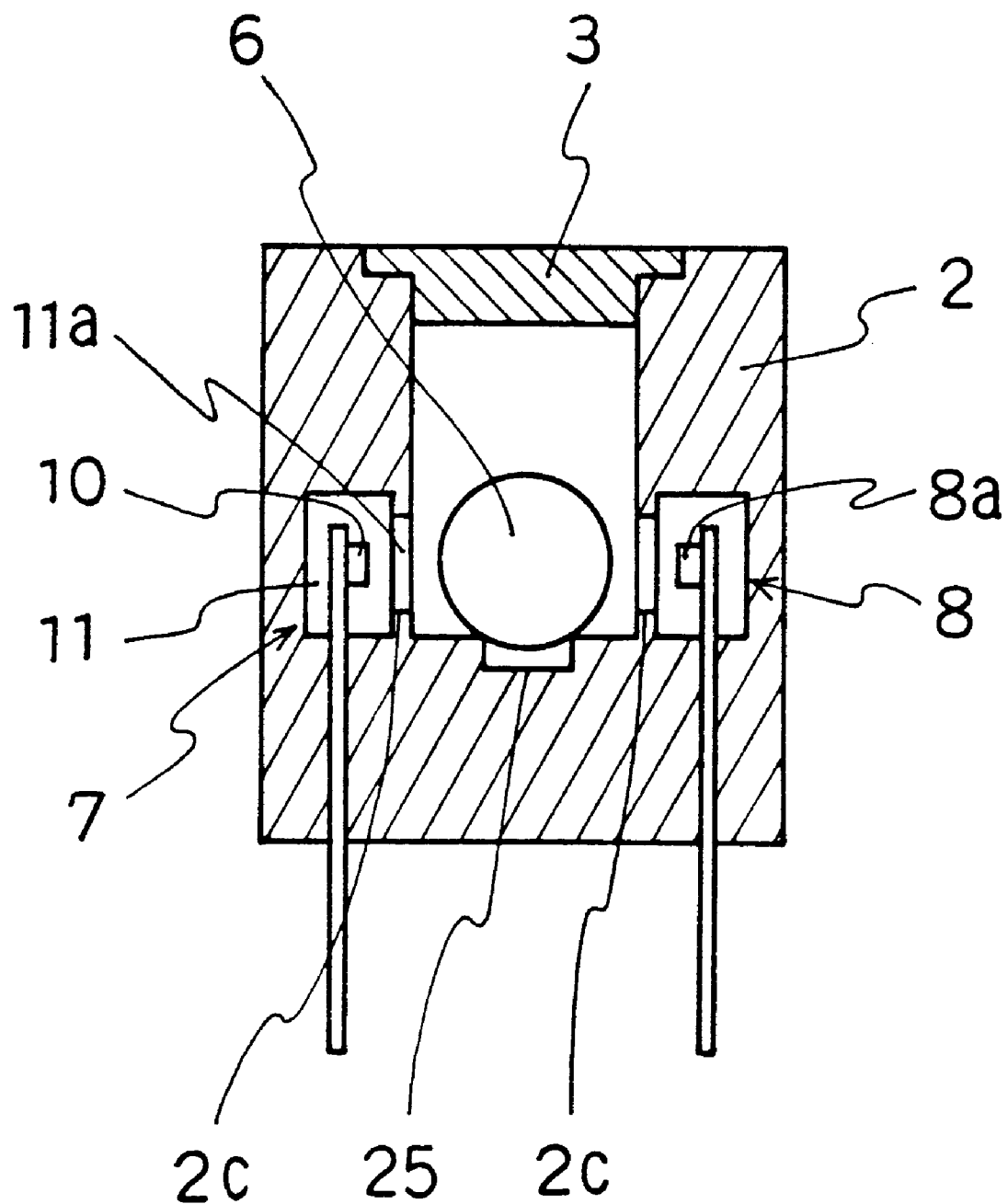
FIG. 1 is a transverse sectional view of a photoelectric tilt-detecting sensor according to the present invention.

Referring first to FIG. 1, there is illustrated a transverse cross-sectional view of a photoelectric tilt-detecting sensor according to the present invention. The photoelectric tilt-detecting sensor has a light-emitting element 7 for emitting light depending on an electric signal supplied thereto, and a light-receiving element 8 provided opposed to the light-emitting element 7 for receiving light emitted from the light-emitting element 7. These light-emitting element 7 and the light-receiving element 8 are fixed in a main body 2. The main body 2 is formed of a light-shielding resin to encapsulate these light-emitting and light-receiving elements 7, 8 with slant surfaces provided therebetween as stated later. The photoelectric tilt-detecting sensor also has a lid 3 fitted to the main body 2, so that a spherical ball 6, e.g., of stainless steel is accommodated movable within a space defined between the main body 2 and the lid 3.

Figure 2:
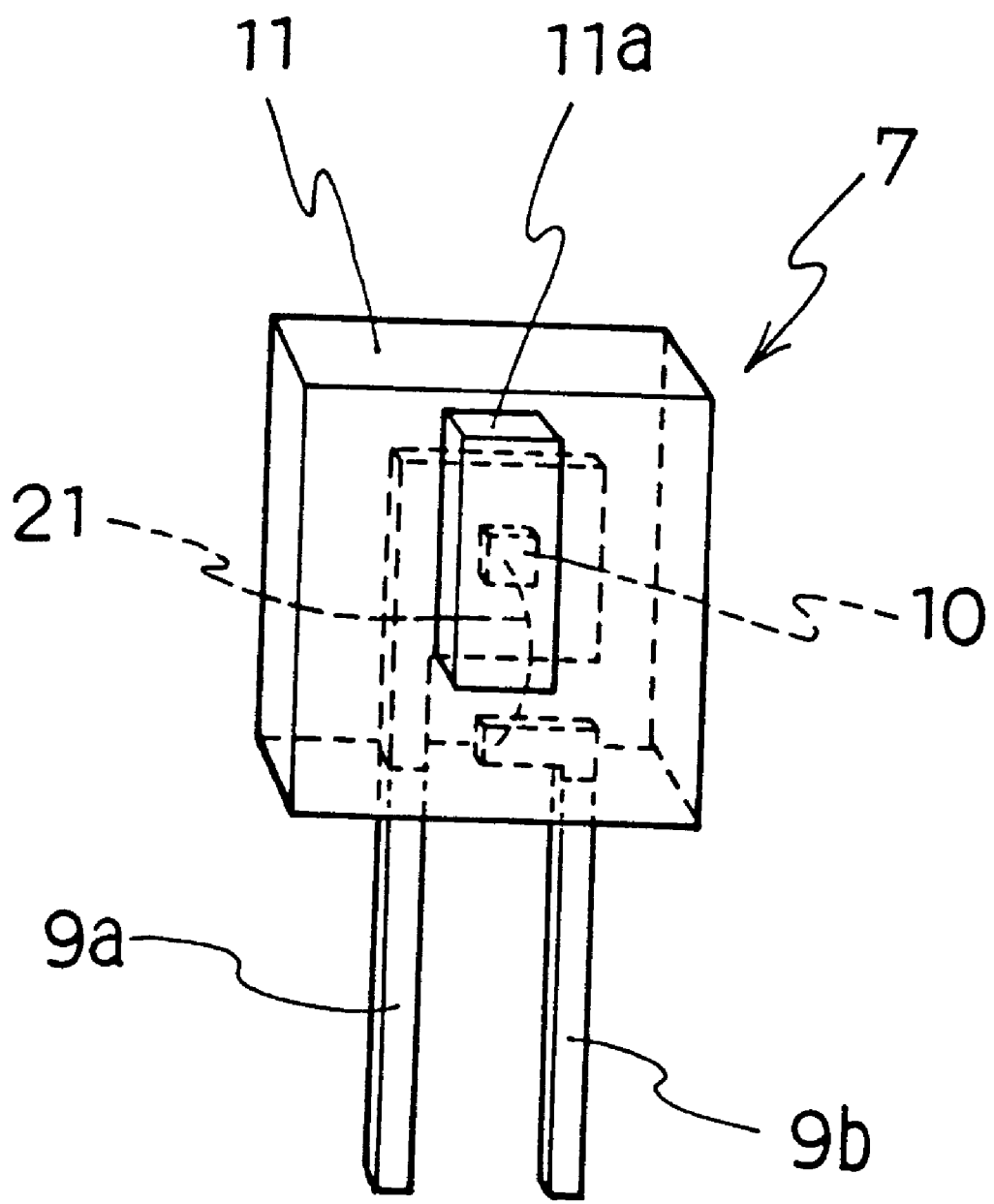
FIG. 2 is a perspective view of a light-emitting element of the photoelectric tilt-detecting sensor of FIG. 1.

The light-emitting element 7, as shown in FIG. 2, has a set of lead electrodes 9a, 9b formed of an electrically-conducting material such as Fe. One lead electrode 9a has a light-emitting diode 10 on a tip thereof die-bonded through, e.g., an Ag paste. The light-emitting diode 10 is electrically connected via an Au wire 21 to the other lead electrode 9b. These light emitting diode 10 and the Au wire 21, together with tip portions of the lead electrodes 9a, 9b, are encapsulated by molding a transparent or light-transmitting resin to form a transparent resin body 11. The transparent resin body 11 has a projecting portion 11a in a rectangular form which projects forward with respect to the light-emitting diode 10, enabling formation of a light-transmission window, stated later, in the main body 2 to be formed of an opaque resin.

On the other hand, the light-receiving element 8 is constructed similar to the light-emitting element 7, except that a photo-transistor is employed instead of the light-emitting diode for the light-emitting element. With such a structure, the photo-transistor generates an electric voltage to supply an electric current through the lead electrodes when light is irradiated thereto. Detailed further explanation on the light-receiving element 8 is omitted.

Figure 3:
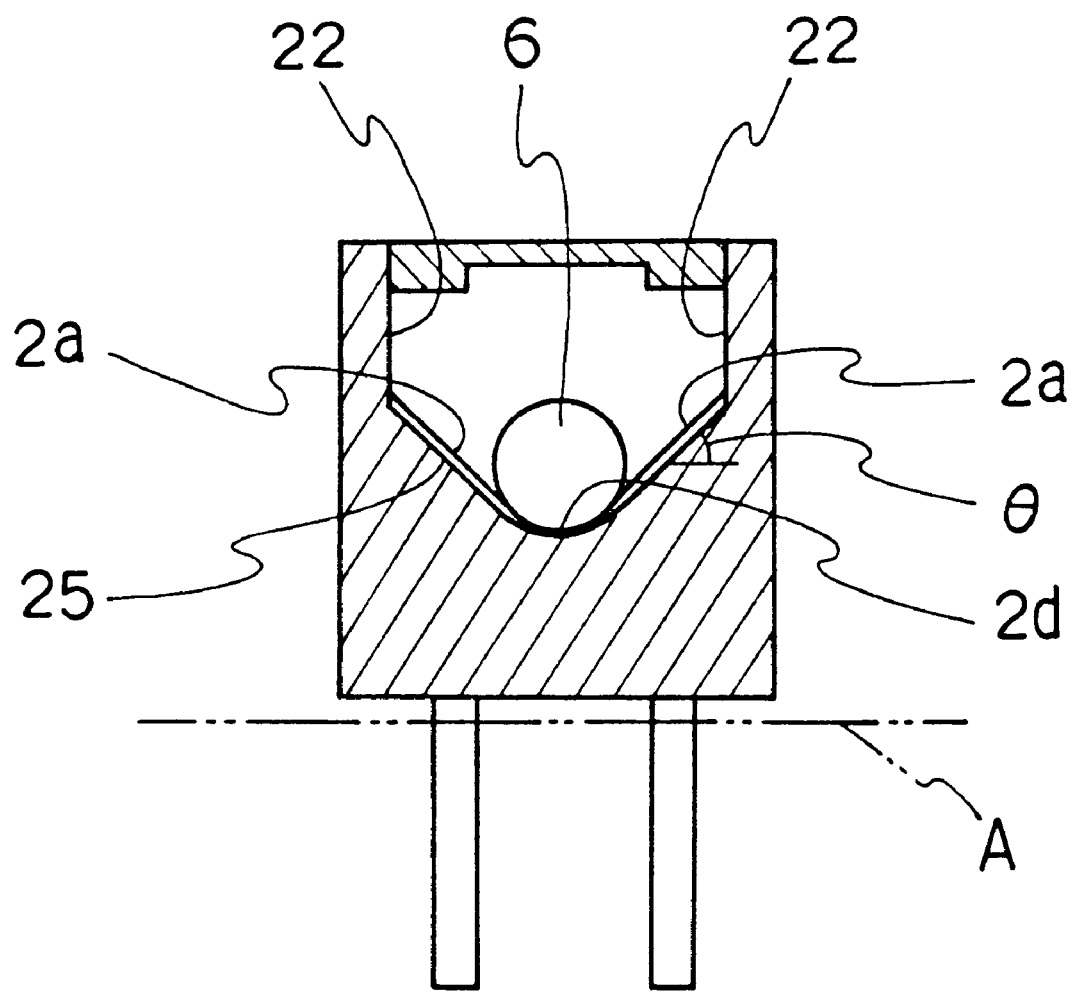
FIG. 3 is a longitudinal sectional view of the photoelectric tilt-detecting sensor of FIG. 1.

The main body 2 is formed of an opaque or light-shielding resin. As shown in FIG. 3, the main body 2 has two opposite slant surfaces 2a, 2a formed slant at a given angle θ with respect to a horizontal or reference plane A. These slant surfaces 2a, 2a have a bottom 2d extending continuous therebetween. The bottom 2d is of a curved surface having a radius corresponding to that of the spherical ball 6. The light-emitting element 7 and the light-receiving element 8 are arranged in a symmetrical relation with respect to the spherical ball 6 resting at a position on the bottom 2d, hereinafter referred to as the "reference position". This allows the light-emitting and light-receiving elements 7, 8 to cooperatively detect the presence or absence of the spherical ball 6 existing at the reference position.

Referring again to FIG. 1, a window 2c is provided in the main body 2 on the side of the light-emitting element 7, which is defined by the projecting portion lha of the transparent resin body 11 of the light-emitting element 7. The provision of the window 2c enables the transmission of light emitted from the light-emitting diode 10 toward the light-emitting element 8 via the projecting portion Ila of the transparent resin body 11. Similarly, another window 2c is provided also on the side of the light-receiving element 8 at a location corresponding to the window 2c for the light-emitting element 7 so that a photo-transistor 8a can receive the light emitted from the light-emitting diode 10 of the light-emitting element 7.

Figure 4:
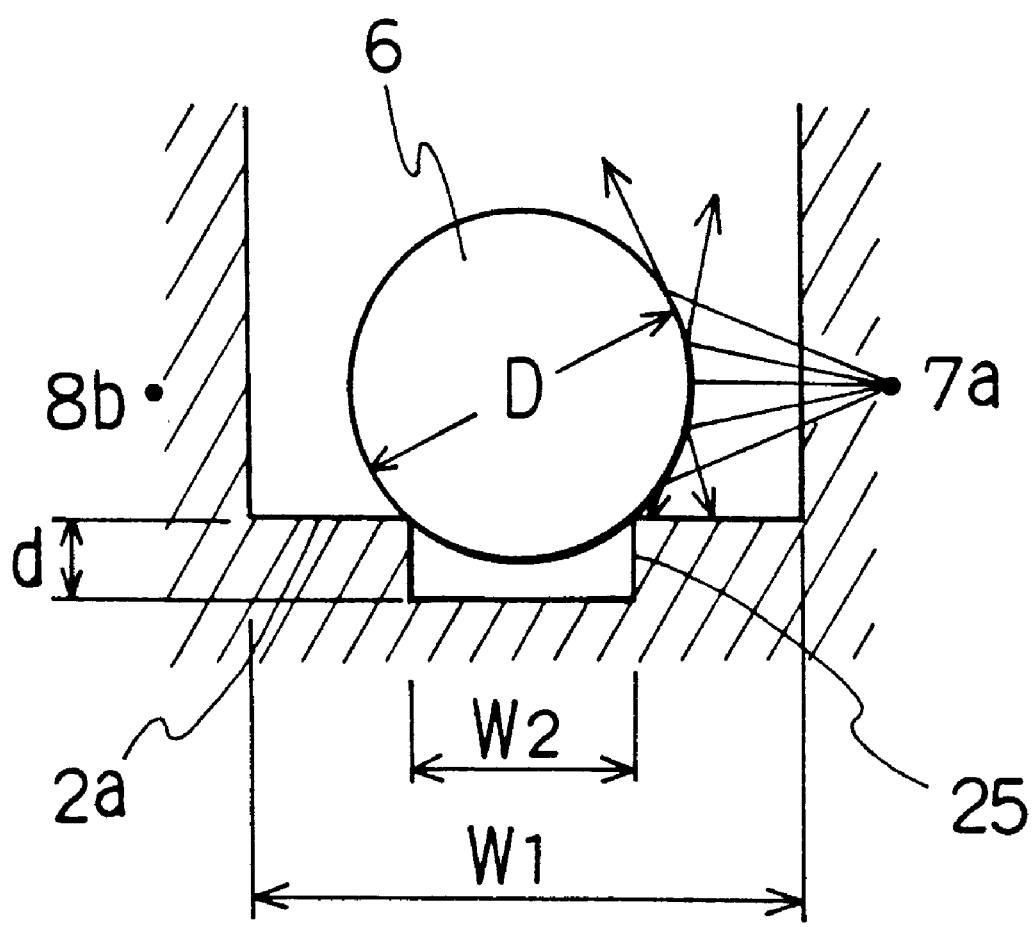
FIG. 4 is an explanatory view for showing the operation of the photoelectric tilt-detecting sensor according to the present invention.

Referring back to FIG. 3, an elongate groove (ball guide means) 25 is formed extending along the entire slant surfaces 2a, 2a including the bottom 2d. The elongate groove 25 has a cross section of a constant shape throughout the extension thereof. The shape of the elongate groove 25 is typically of rectangular. More specifically, it is possible to determine the cross-sectional shape of the elongate groove 25 to a width W2, e.g., of approximately 0.7 mm, and a depth d, e.g., of approximately 0.2 mm, as shown in FIG. 4, where the width W1 of the slant surface 2a is approximately 1.3 mm and the diameter D of the spherical ball 6 is approximately 1.0 mm.

The operation of the photoelectric tilt-detecting sensor constructed as above is then described hereinbelow.

Now, it is assumed that the tilt-detection sensor is used by mounting or fixing it on an object to be detected, to detect on whether the object is inclined in excess of a certain degree or not. While the angle of inclination for the object to be detected and hence the photoelectric tilt-detecting sensor is smaller than the angle θ defined by the slant surface 2a, the spherical ball 6 rests stationary in the reference position, as understood from FIG. 3. In this state, the light emitted from a light-emitting point 7a of the light-emitting element 7 is reflected or shielded by the presence of the spherical ball 6 existing in the reference position. As a result, no light is transmitted to a light-receiving point 8b of the light-receiving element 8.

On the other hand, when the object being detected inclines exceeding the angle θ in one direction, the spherical ball 6 moves along the elongate groove 25 toward the side inclined downward to a position where the spherical ball 6 comes to abutment against the end wall 22. In this state, the spherical ball 6 does not exist between the light-emitting element 7 and the light-receiving element 8. Accordingly, the light emitted from the light-emitting element 7 is directly transmitted to the light-receiving element 8, so that the photo-transistor generates an electric current in an amount commensurate with the amount of light received by the photo-transistor.

It is therefore possible to readily recognize whether the object to be detected is tilted exceeding the angle θ or not by detecting the amount of electricity generated by light received by the light-receiving element 8.

Meanwhile, provided that no elongate groove is formed in the slant surfaces 2a, 2a, the light emitted from the light-emitting point 7a as a center of light radiation for the light-emitting element 7 is reflected by the surface of the spherical ball 6 toward various directions during detection of inclination of the object to be detected, as will be understood from FIG. 4. On this occasion, part of the reflected light is secondary-reflected by inner walls such as slant surfaces 2a, 2a of the main body 2 to thereby reach the light-receiving point 8b as a center of light reception. That is, where no elongate groove is provided in the slant surfaces of the sensor, there will occur decrease of difference between transmission and non-transmission of light in respect of the amount of light reception and hence electric current generated, making difficult detection of tilting with accuracy.

On the contrary, the photoelectric tilt-detecting sensor according to the invention has the elongate groove 25 in the slant surfaces 2a, 2a. The elongate groove 25 serves as a guide defining a path of movement for the spherical ball 6, providing stabilized movement for the spherical ball 6. Thus, there is less possibility for the spherical ball 6 of contacting with or colliding against inner side walls. Further, the elongate groove 25 contributes to effectively decrease the amount of light reflected through the slant surfaces 2a, 2a because such reflected light is partly directed toward the inside of the elongate groove 25, when reflection occurs on the surface of the spherical ball 6. It is noted that part of the light directed to the elongate groove 25 is trapped therein. Therefore, there is an increase of difference in amount of electric current between shielding of light during non-tilting of the sensor and transmission of light during tilting of the same, providing certainty of detection of tilting.

Incidentally, although the above example has the elongate groove provided solely on the side of the slant surfaces of the main body, the present invention is not limited to such structure. Alternatively, an additional elongate groove may be provided on the side of the lid in a manner corresponding to the elongate groove of the (lower) slant surfaces, in order to further reduce the amount of light transmitted via the upper side of the spherical ball.

Figure 5A:
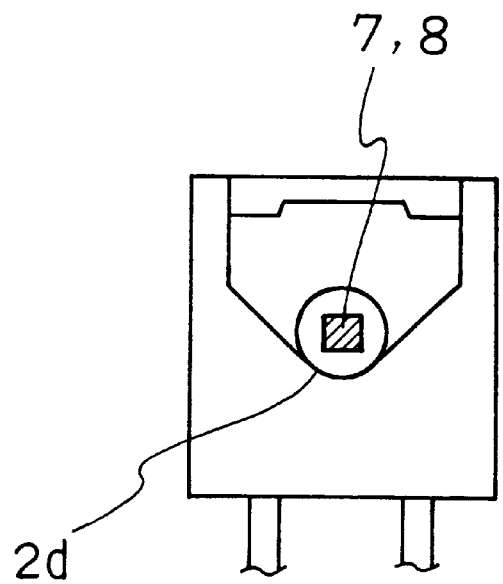
FIGS. 5(a)–5(b) are schematics showing positions of fixing light-emitting and light-receiving elements of a photoelectric tilt-detecting sensor according to the present invention.
Figure 5B:
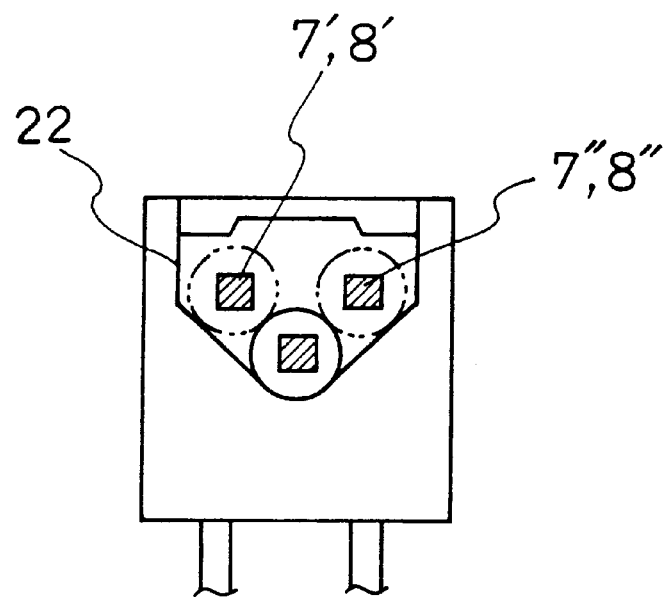

In the above-stated structure, one set of the light-emitting element 7 and the light-receiving element 8 are fixed in a symmetrical relation in the main body 2 with respect to the reference position of the spherical ball 6, as shown in FIG. 5(a). With such a structure, however, it is impossible to detect the directionality of tilting, though the presence or absence of tilting is detectable. In the meanwhile, if light-emitting elements 7', 7" and light-receiving elements 8', 8" are additionally provided at locations corresponding to respective positions of spherical ball 6 abutting against opposite end walls 22, as shown in FIG. 5(b), it becomes possible to detect the directionality to which direction the sensor is in tilting.

Figure 6A:
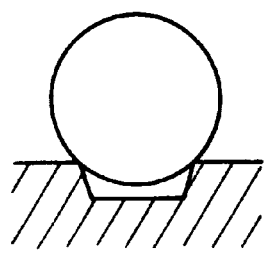
FIGS. 6(a)–6(c) are schematics showing modification of elongate grooves.
Figure 6B:
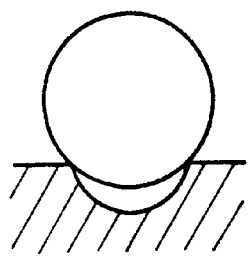
Figure 6C:
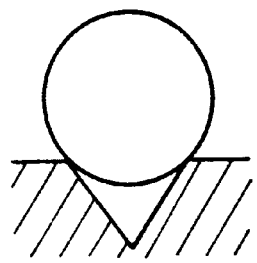

The elongate groove 25 may be formed in various cross-sectional shapes as shown in FIGS. 6(a) to 6(c), instead of the rectangular form stated above. The elongate groove 25 may be provided such that the groove increases its width in cross section from the bottom toward the opening of the groove, as shown in FIG. 6(a). With such configuration, die-forming of the main body is facilitated, particularly upon separation of dies, providing convenience for fabrication processes. Also, the elongate groove may be provided in an arcuate form as shown in FIG. 6(b) or otherwise a V-shape as shown in FIG. 6(c).

Incidentally, in the above embodiment, the slant surfaces are exemplified by the opposite two slant surfaces, but the present invention is not limited to such structure. Alternatively, it is also possible to constitute a single slant surface for detecting inclination in an arbitrary one direction.

Figure 7A:
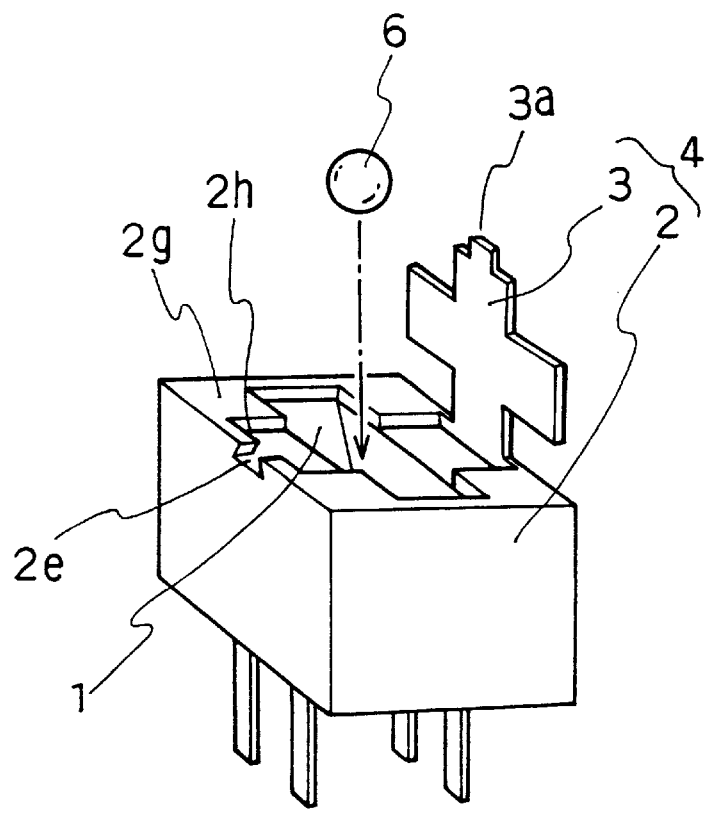
FIGS. 7(a)–7(b) are perspective view showing a claw and an engaging groove for engagement therewith.
Figure 7B:
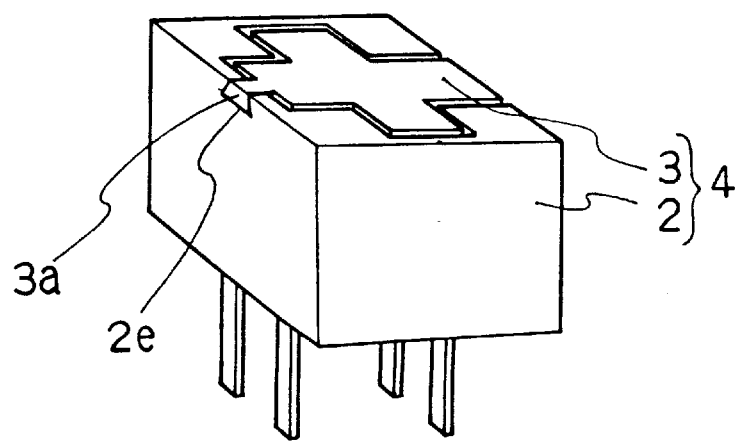

The lid 3 is formed of an opaque or light-shielding resin, which is generally of a cross-shaped sheet connected at one end thereof to the main body 2 The lid 3 and the main body 2 constitute an integral opaque resin body 4, as shown in FIG. 7(a). In this embodiment, the opaque resin body 4 is of a polycarbonate resin, providing sufficient flexibility. Accordingly, there is almost no fear of occurrence of breakage or cracks upon bending toward the main body 2 accommodating therein a spherical ball 6, as shown in FIG. 7(b). The lid 3 has a trapezoidal claw 3a formed projecting from the other end thereof, whereas an engaging groove 2e is formed in the top surface 2g of the main body 2, enabling engagement of the trapezoidal claw 3a in the engaging groove 2e. The lid 3 is configured for being fitted in recesses 2h oppositely formed in the top surface 2g of the main body 2 and continuous with the engaging groove 2e, shielding the interior of the main body 2 from external light.

In this manner, the lid 3 integral with the main body 2 is positively fixed by bending onto the main body 2 so that the claw 3a is engaged with the engaging groove 2e. Therefore, the lid 3 will not disengage from the main body 2 leading to falling of the spherical ball 6 out of the space 1 of the main body 2, even where an external impact force is applied to the sensor and the spherical ball 6 is caused to collide against the inner wall of the lid 3. With such a structure, no adhesive is necessary for fixing the lid 3 on the main body 2. Accordingly, no disadvantages are involved resulting from usage of an adhesive. That is, there is inconvenience in the usage of an adhesive. If an adhesive is spotted on the inner walls including the slant surfaces or the spherical ball, the spherical ball is prevented from smooth moving along the slant surfaces. Further, spotting with an adhesive may react with the resin to produce a chloride gas or the like, leading to oxidation of metal parts of the sensor. In the present embodiment, a polycarbonate resin is used for the opaque resin body 4, which is excellent in flexibility so that a connecting portion between the lid 3 and the main body 2 will not have breakage or cracks when a bending force is applied thereto. Alternatively, other flexible resins such as an ABS resin may be used for the opaque resin body. And in this embodiment, no elongate groove may be provided.

Figure 8A:
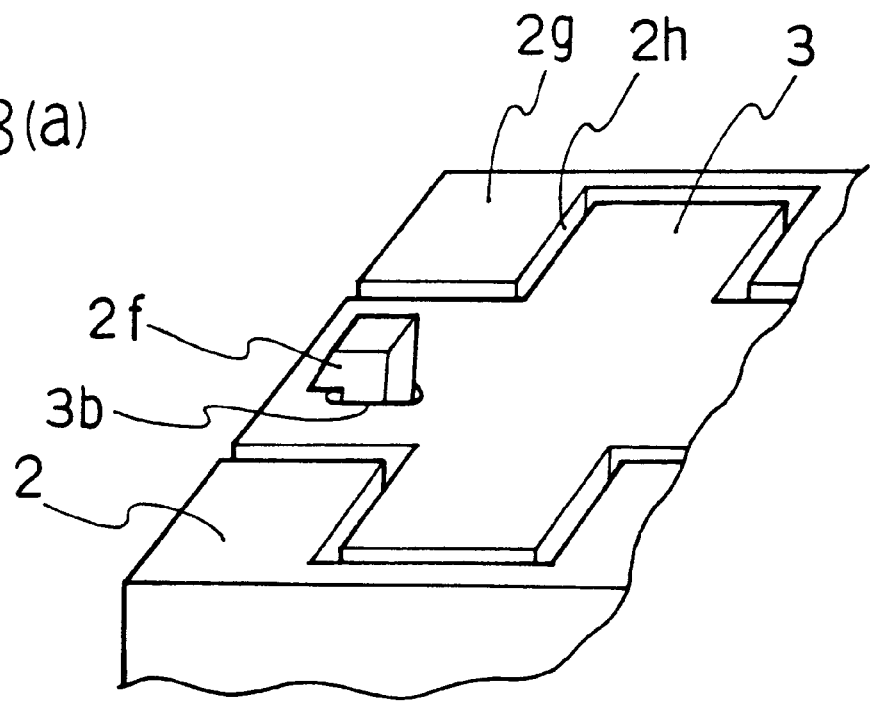
FIGS. 8(a)–8(d) are views useful for explaining various modifications according to the present invention.

To engage the lid 3 with the main body 2, a through-hole 3b may be formed in the lid 3 to receive a claw 2f provided on the main body 2 as shown in FIG. 8(a), instead of engaging of claw 3a with the engaging groove 2e as stated above.

Figure 8B:
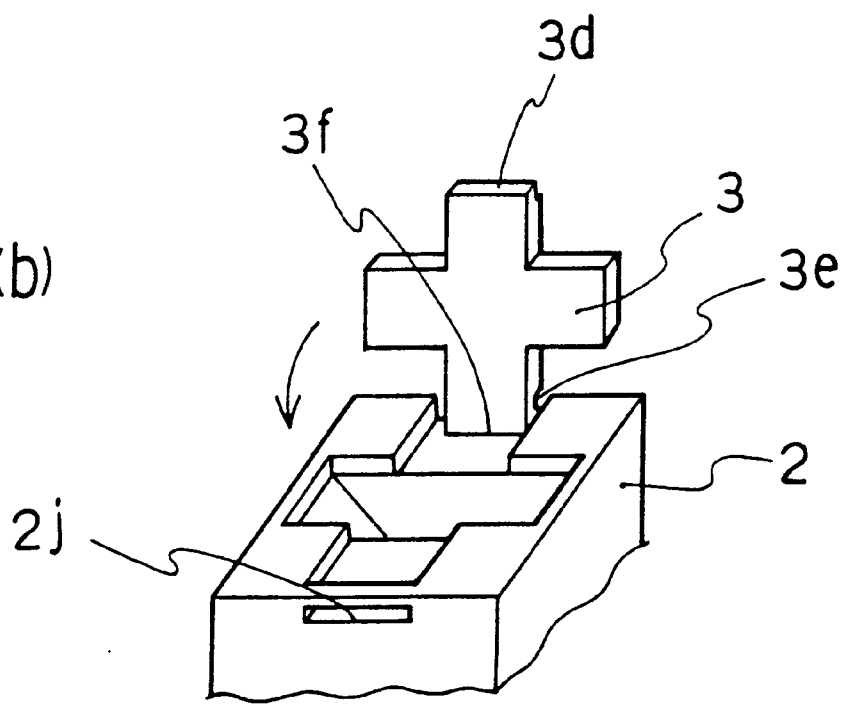

The fitting of the lid 3 with the main body 2 may be made as shown in FIG. 8(b). That is, a through-hole 2j is formed in a top lateral wall of the main body 2, and a claw 3d is formed at a tip end of the lid 3, so that the lid 3 is bent onto the main body 2 to insert the claw 3d into the through-hole 2j. The thickness of the claw 3d is preferably, e.g., 0.3 mm for a thickness 0.7 mm for the lid 3d. In such a case, the vertical size of the through-hole 2j is preferably approximately 0.5 mm. The claw 3d has a tip face chamfered at, e.g., 45 degrees in order to facilitate insertion of the claw 3d into the through-hole 2j. The through-hole 2j is provided underneath by approximately 0.4 mm the top surface of the main body 2. In the figure, the claw 3d has a width thereof equivalent to that of the end of the lid 3d connected thereto. However, the width of the claw 3d, being not limited to this, may be smaller than the width of the lid 3.

The connecting portion between the lid 3 and the main body 2 has a cut-away groove 3e in an upper or outer edge thereof to facilitate bending of the lid 3. For example, the cut-away groove 3e is provided above the bottom line 3f of the lid 3 by approximately 0.2 mm, with the width of 0.5 mm and the depth of 0.4 mm, approximately.

Figure 8C:
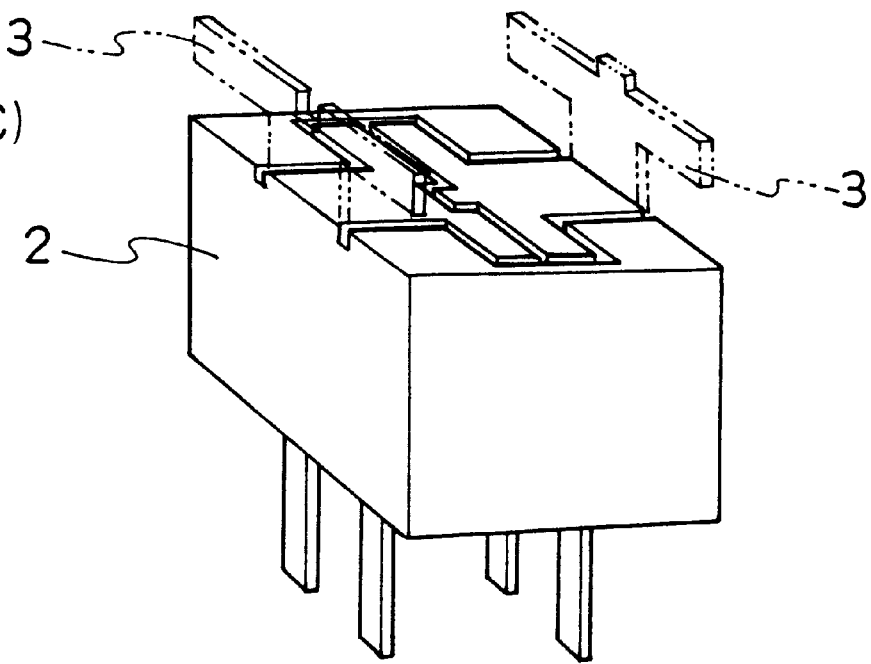
Figure 8D:
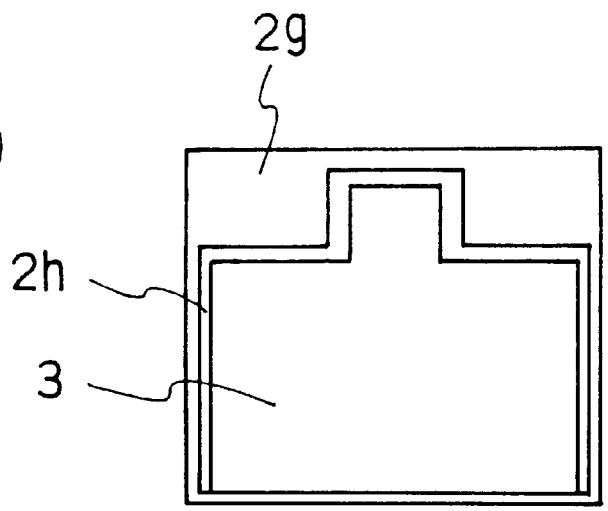

Also, two lids 3, 3 may be provided in a symmetrical form so that they are bent inward to cover the space of the main body 2, as shown in FIG. 8(c). In such case, a claw and a groove for engagement are formed in the respective tips of the lids 3, 3. Further, the lid is not limited to the cross shape. It may be of a generally rectangular form, as shown in FIG. 8(d).

The photoelectric tilt-detecting sensor constructed as above may be fabricated in a manner described below. The fabrication method includes a first step of resin-forming an opaque resin body 4 comprising a main body 2 and the lid 3, a second step of placing a spherical ball 6 into a space 1b, and a third step of bending a lid 3 to enclose the space 1b of the main body 2.

Figure 9A:
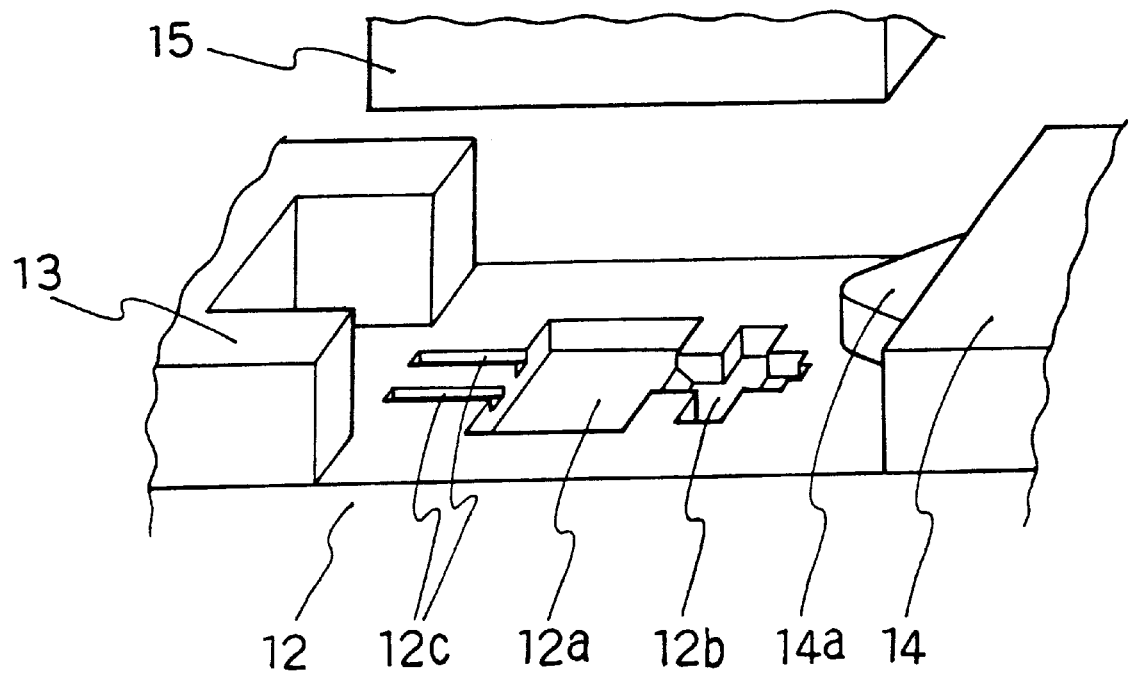
FIGS. 9(a)–9(b) are views for explaining a fabricating method for a photoelectric tilt-detecting sensor according to the present invention.

In the first step shown in FIG. 9(a), a set of dies are employed, which involve a lower die 12, right and left intermediate dies 13, 14, and an upper die 15. The lower die 12 has recesses 12a, 12b, and 12c formed continuous in the surface thereof. The lower die 12 is fixed stationary on a base plate, not shown. The intermediate dies 13, 14 are placed movable toward closing to each other. The intermediate die 14 has a triangularly formed projection 14a formed at the tip thereof. The upper die 15 also has recesses, not shown, corresponding to the recesses 12a, 12c of the lower die 12.

Figure 9B:
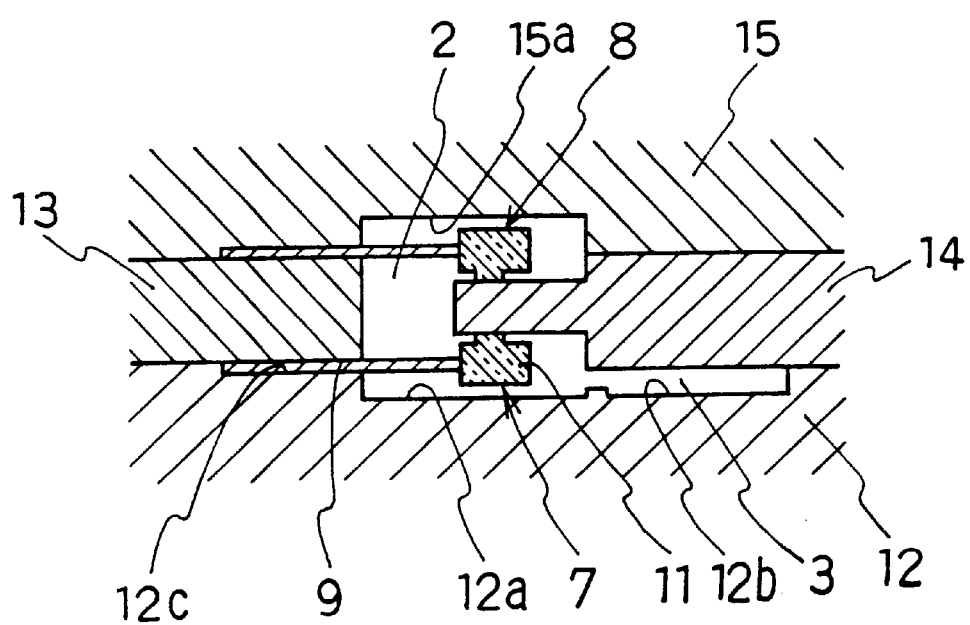

With the dies, an opaque resin body 4 is molded by filling a molten polycarbonate resin into a cavity defined between the dies. To mold the opaque resin body 4, a light-emitting element 7 is first placed on the lower die 12 such that the transparent resin body 11 and the lead terminals 9 are respectively rested on the recesses 12a and 12c. Then, the intermediate dies 13, 14 are moved closing to each other, as shown in FIG. 9(b). A light-receiving element 8 is then placed to bridge over the intermediate dies 13, 14 in a manner corresponding to the light-emitting element 7, followed by bringing down the upper die 15. By filling a resin into the cavity, a main body 2 and a lid 3 are respectively formed by the recesses 12a, 15a and the recess 12b of the dies. As was explained, the recesses 12a and 12b are continuous to integrate the main body 2 and the lid 3. Incidentally, the movement of the intermediate dies 13, 14 as well as the upper die 15 is carried out by the utilization of pneumatic cylinders, not shown.

Figure 10:
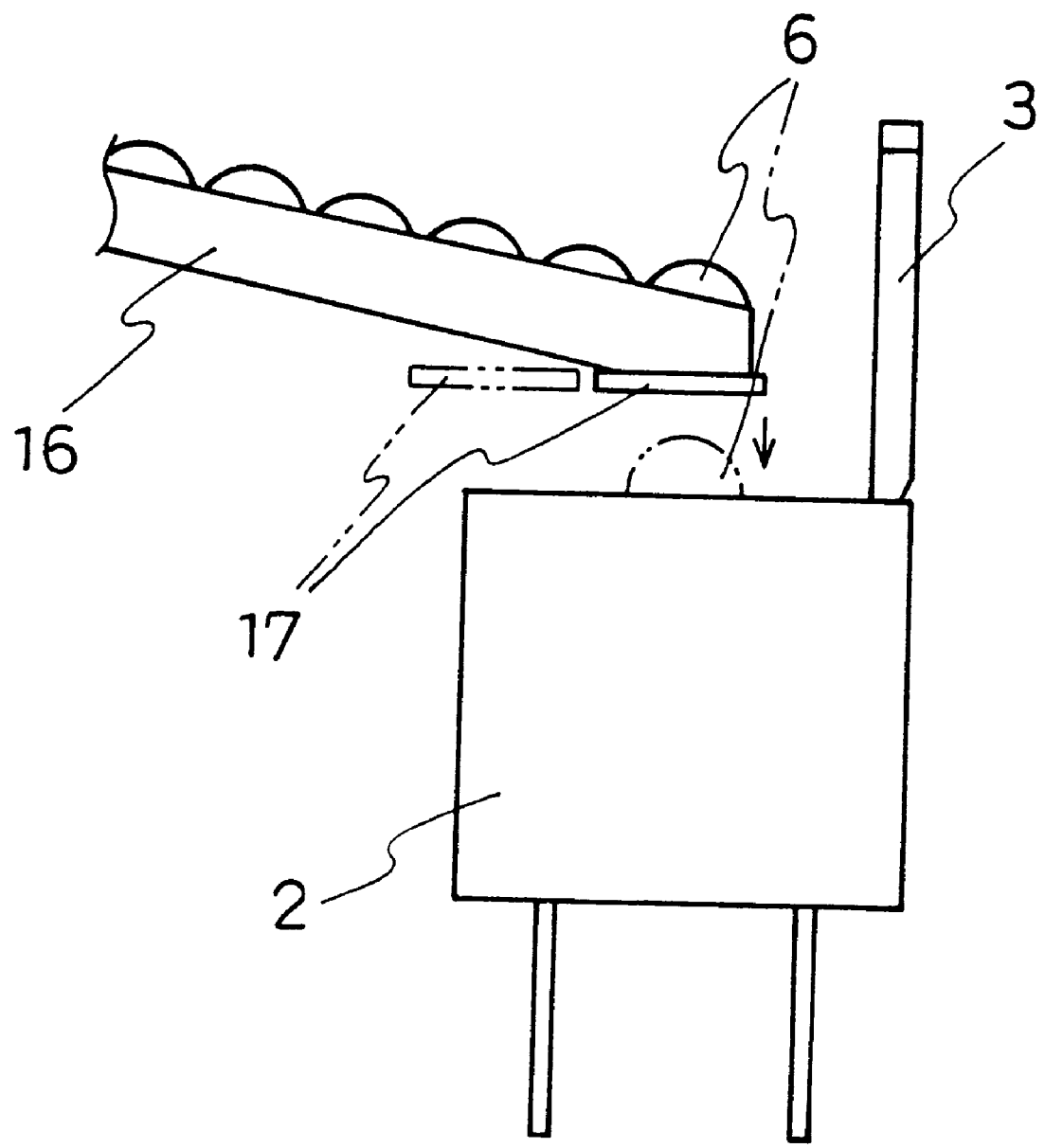
FIG. 10 is a side view for explaining insertion of a spherical ball into a space of the main body.

In the subsequent second step, spherical balls 6 are delivered from a parts feeder, not shown, through a chute 16, as shown in FIG. 10. The spherical balls 6 are lined in the chute 16, and sequentially fallen into a space of the opaque resin body 4 by opening and closing a shutter plate 17. The operation of the shutter plate 17 is carried out by actuating a pneumatic cylinder in synchronism with the movement of the opaque resin body 4.

The lid 3, which is provided vertical to and integral wit h the main body 2, helps place a spherical ball 6 into the e space of the main body 2. The presence of the lid 3 serves to reduce possible failure of accommodating a spherical ball 6 in the main body 2.

Figure 11:
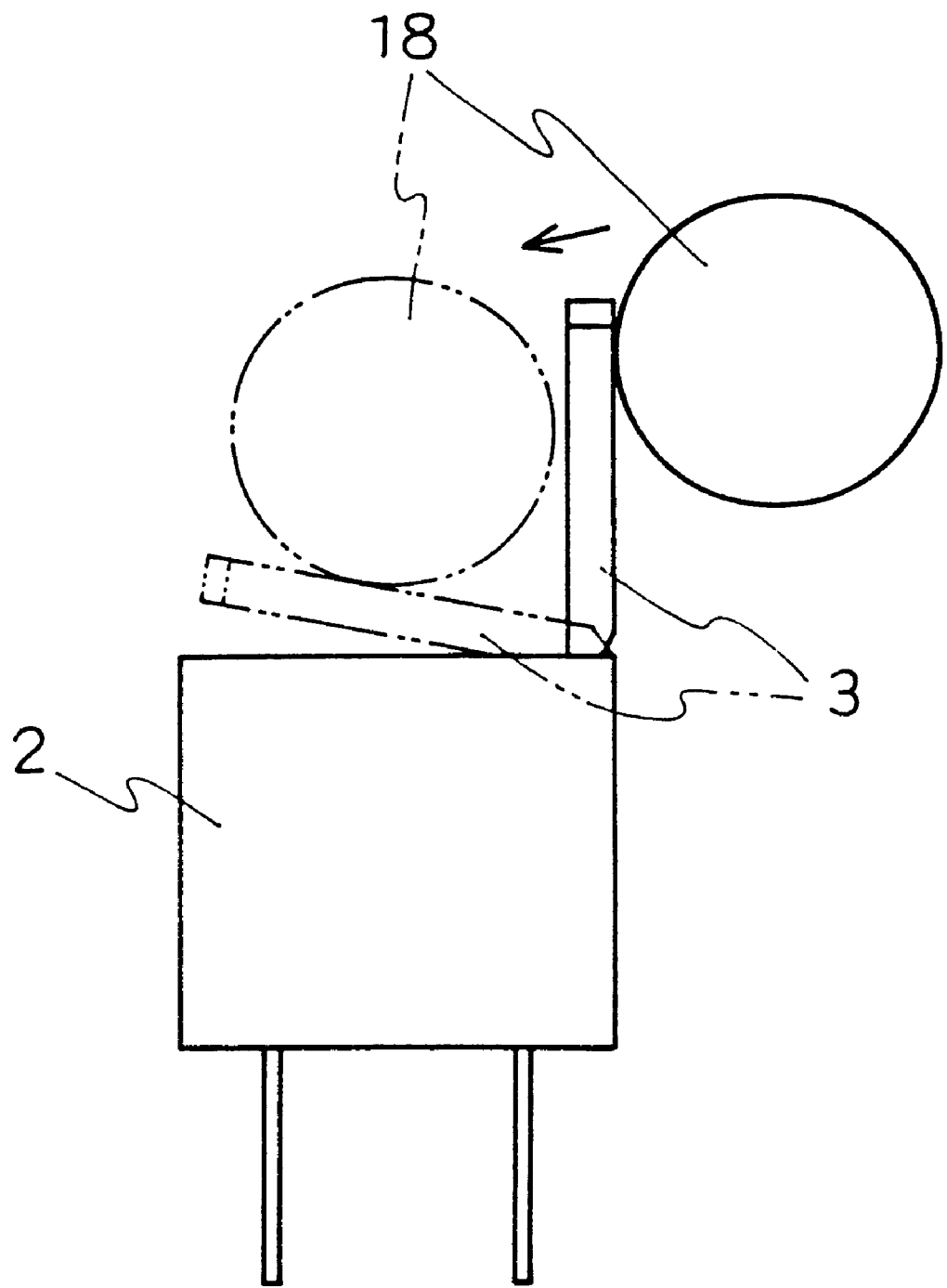
FIG. 11 is a side view for explaining the manner of bending a lid.

In the third step, the lid 3 is bent at a connecting portion thereof by moving a cylindrical roller 18 in a direction shown by the arrow, as shown in FIG. 11. On this occasion, a claw 3a of the lid 3 is brought into engagement with a groove 2e of the main body 2, ensuring firm fixing of the lid 3 over the main body 2.

Figure 12:
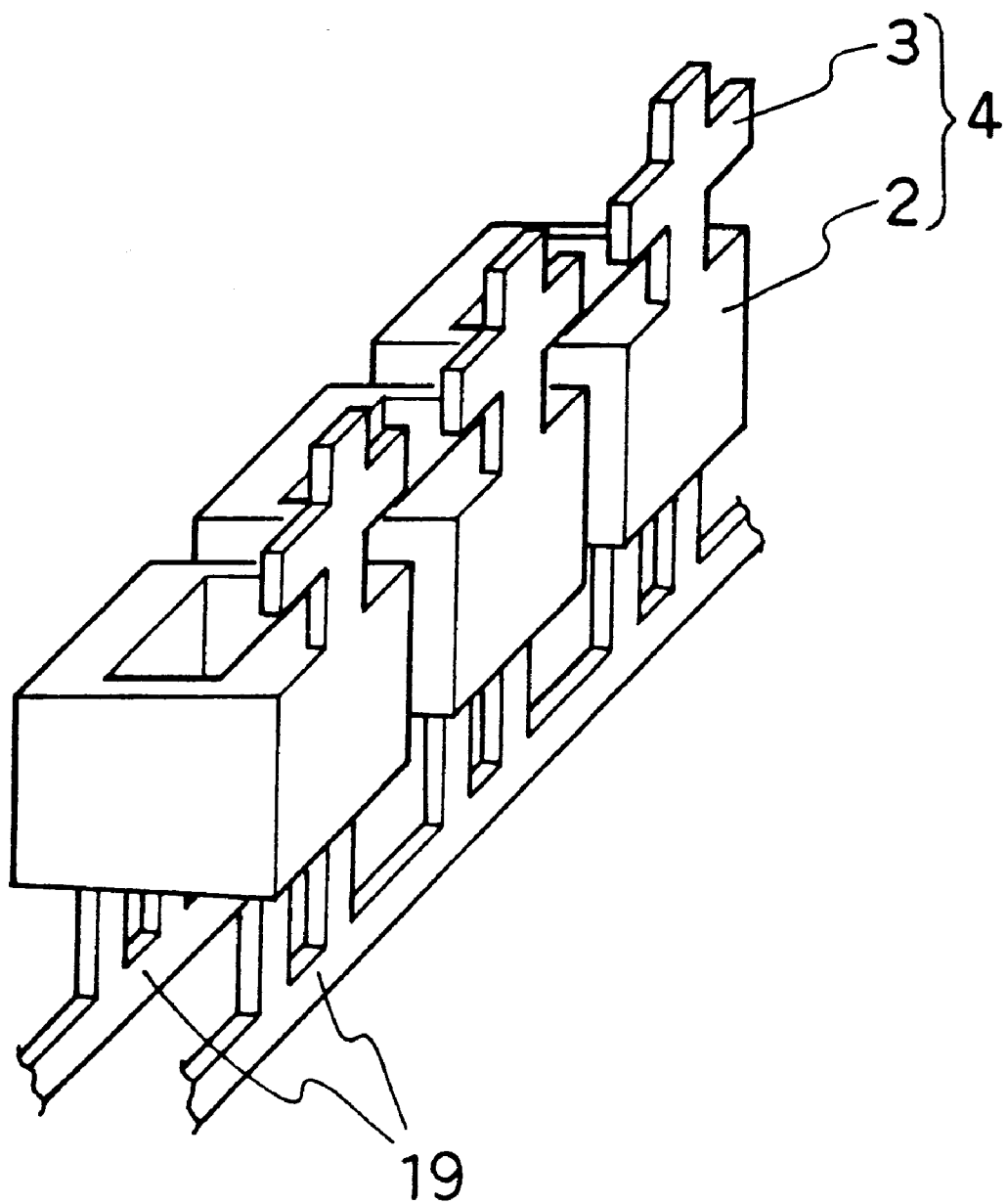
FIG. 12 is a perspective view showing modification of the fabricating method for photoelectric tilt-detecting sensor.
Figure 13:
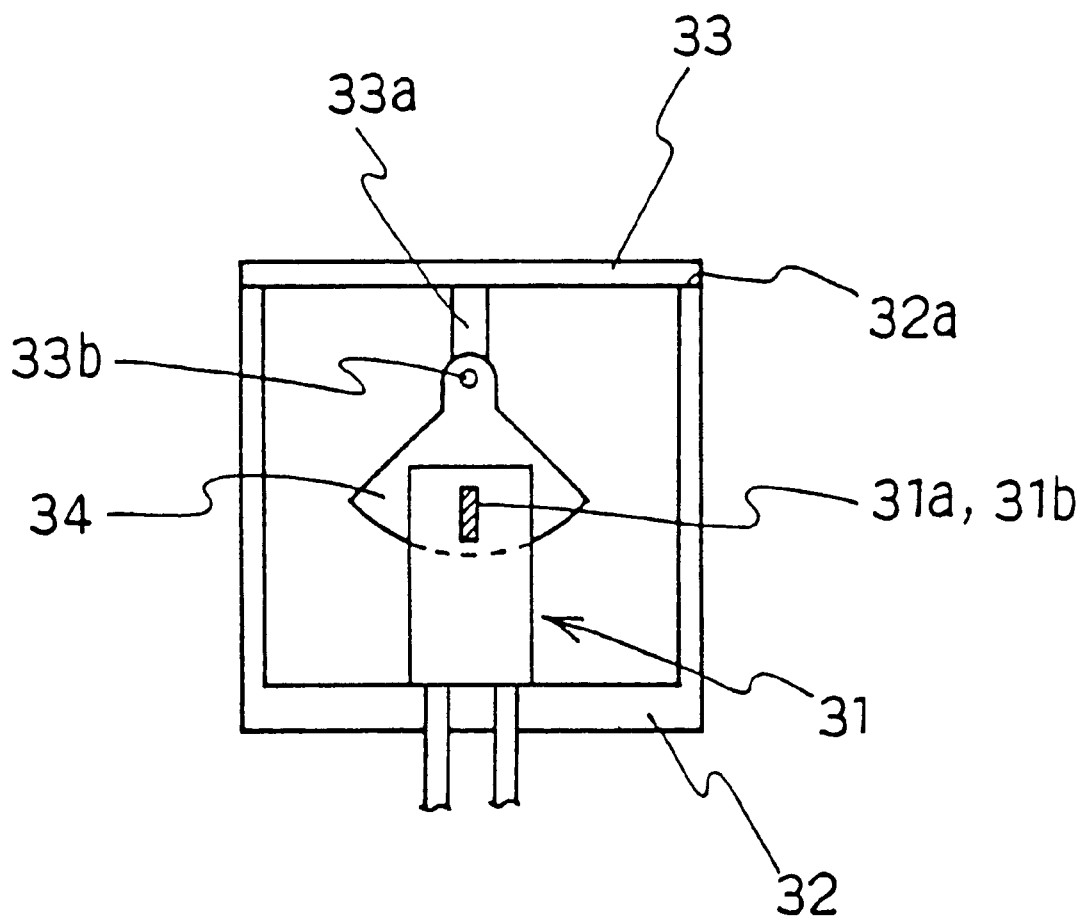
FIG. 13 is a sectional view of a conventional photoelectric tilt-detecting sensor.

In the preset invention, it is possible to employ a set of elongate lead frames 19, 19 having a plurality of opaque resin bodies 4 formed thereon, as shown in FIG. 12. That is, light-emitting and light-receiving elements are first formed on respective lead frames 19, 19, so that a plurality of opaque resin bodies 4 are to be formed at one time. In such cases, the lids 3 may be bent in a batch by the use of an elongate cylindrical roller. Further, it is possible to supply spherical balls simultaneously to the respective main bodies 2 through the use of a plurality of chutes arranged at the same pitch as the main bodies. This raises efficiency of fabricating the sensors, realizing production on a commercial scale.

What is claimed is:

1. A method of fabricating a photoelectric tilt-detecting sensor having a light-emitting element and a light-receiving element provided in an opposed relation so as to accommodate a spherical ball therebetween, comprising the steps of:

preparing forming dies, said dies having a cavity for forming a main body and a lid connected at one end thereof to said main body, and forming engaging parts with claw and engaging groove, said claw and engaging groove being formed respectively at the other end of said lid and at a portion of the main body faced to said other end of said lid when said lid is bended;

placing a light-emitting element and a light-receiving element between said dies;

filling a resin into said cavity of said dies to provide a main body and a lid in one body and slant surfaces defining a space between said light-emitting element and said light-receiving element in said main body;

inserting a spherical ball into said space of said main body after setting of said resin; and bending said lid for engagement at the other end thereof with said main body.

2. The method of claim 1, wherein a plurality of light-emitting elements are prepared as said light-emitting element on a lead frame, a plurality of light-receiving elements are prepared as said light-receiving element on another lead frame, and said lead frames having light-emitting elements and light-receiving elements are placed between said dies to thereby forming a plurality of main bodies at one time.

* * * * *